(12) United States Patent
Jain et al.

(10) Patent No.: US 10,983,412 B1
(45) Date of Patent: Apr. 20, 2021

(54) SILICON PHOTONIC COMPONENTS FABRICATED USING A BULK SUBSTRATE

(71) Applicant: GLOBALFOUNDRIES U.S. Inc., Santa Clara, CA (US)

(72) Inventors: Vibhor Jain, Essex Junction, VT (US); Siva P. Adusumilli, South Burlington, VT (US); John J. Ellis-Monaghan, Grand Isle, VT (US)

(73) Assignee: GLOBALFOUNDRIES U.S. INC., Santa Clara, CA (US)

(*) Notice: Subject to any disclaimer, the term of this patent is extended or adjusted under 35 U.S.C. 154(b) by 0 days.

(21) Appl. No.: 16/674,711

(22) Filed: Nov. 5, 2019

(51) Int. Cl.
| | |
|---|---|
| *G02F 1/225* | (2006.01) |
| *G02F 1/025* | (2006.01) |
| *G02F 1/01* | (2006.01) |
| *G02B 6/122* | (2006.01) |
| *H01L 31/0232* | (2014.01) |
| *G02B 6/12* | (2006.01) |
| *G02B 6/136* | (2006.01) |
| *G02F 1/21* | (2006.01) |

(52) U.S. Cl.
CPC .......... *G02F 1/2257* (2013.01); *G02B 6/122* (2013.01); *G02F 1/011* (2013.01); *G02F 1/0147* (2013.01); *G02F 1/025* (2013.01); *H01L 31/02327* (2013.01); *G02B 6/136* (2013.01); *G02B 2006/12061* (2013.01); *G02B 2006/12085* (2013.01); *G02B 2006/12097* (2013.01); *G02B 2006/12142* (2013.01); *G02B 2006/12159* (2013.01); *G02B 2006/12176* (2013.01); *G02F 2001/212* (2013.01); *G02F 2201/063* (2013.01)

(58) Field of Classification Search
None
See application file for complete search history.

(56) References Cited

U.S. PATENT DOCUMENTS

| | | | | |
|---|---|---|---|---|
| 6,770,882 | B2* | 8/2004 | Carr | G01J 3/26 |
| | | | | 250/332 |
| 8,772,902 | B2 | 7/2014 | Assefa et al. | |
| 9,274,277 | B2 | 3/2016 | Brown et al. | |
| 2004/0258344 | A1* | 12/2004 | Fardi | G02F 1/025 |
| | | | | 385/14 |
| 2004/0264836 | A1* | 12/2004 | Kawashima | G02F 1/025 |
| | | | | 385/14 |
| 2011/0235971 | A1* | 9/2011 | Hashimoto | B82Y 20/00 |
| | | | | 385/31 |

(Continued)

OTHER PUBLICATIONS

Breck Hitz, "Tiny Mach-Zehnder Modulator Operates at 10 Gb/s", Optics Express, Dec. 10, 2007, pp. 17106-17113.

(Continued)

*Primary Examiner* — Michelle R Connelly
(74) *Attorney, Agent, or Firm* — Thompson Hine LLP; Anthony Canle (57) ABSTRACT

Structures including a photodetector and methods of fabricating such structures. A substrate, which is composed of a semiconductor material, includes a first trench, a second trench, and a pillar of the semiconductor material that is laterally positioned between the first trench and the second trench. A first portion of a dielectric layer is located in the first trench and a second portion of the dielectric layer is located in the second trench. A waveguide core is coupled to the pillar at a top surface of the substrate.

20 Claims, 8 Drawing Sheets

(56) References Cited

U.S. PATENT DOCUMENTS

| | | | |
|---|---|---|---|
| 2019/0391328 A1* | 12/2019 | Li | G02B 6/4214 |
| 2020/0089076 A1* | 3/2020 | Yu | G02F 1/0121 |
| 2020/0158954 A1* | 5/2020 | Coolbaugh | H01L 21/02573 |

OTHER PUBLICATIONS

D. Knoll et al., "High-performance BiCMOS Si photonics platform," 2015 IEEE Bipolar/BiCMOS Circuits and Technology Meeting—BCTM, Boston, MA, 2015, pp. 88-96.

D. Knoll et al., "High-performance photonic BiCMOS process for the fabrication of high-bandwidth electronic-photonic integrated circuits," 2015 IEEE International Electron Devices Meeting (IEDM), Washington, DC, 2015, pp. 15.6.1-15.6.4.

Knoll et al., SiGe BiCMOS for Optoelectronics, © 2016 ECS—The Electrochemical Society.

\* cited by examiner

SILICON PHOTONIC COMPONENTS FABRICATED USING A BULK SUBSTRATE

BACKGROUND

The present invention relates to photonics chips and, more particularly, to structures including a waveguide core and methods of fabricating such structures.

Photonics chips are used in many applications and systems including, but not limited to, data communication systems and data computation systems. A photonics chip integrates optical components, such as waveguides, optical switches, and bends, and electronic components, such as field-effect transistors, into a unified platform. Among other factors, layout area, cost, and operational overhead may be reduced by the integration of both types of components. Silicon optical components rely on the thick buried oxide layer of a silicon-on-insulator wafer to provide a bottom cladding.

Improved structures including a waveguide core and methods of fabricating such structures are needed.

SUMMARY

In an embodiment of the invention, a structure includes a substrate composed of a semiconductor material. The substrate includes a first trench, a second trench, and a pillar of the semiconductor material that is laterally positioned between the first trench and the second trench. The structure further includes a dielectric layer having a first portion in the first trench and a second portion in the second trench. A waveguide core is coupled to the pillar at a top surface of the substrate.

In an embodiment of the invention, a method includes forming a first trench and a second trench in a substrate comprised of a semiconductor material. A pillar of the semiconductor material is laterally positioned between the first trench and the second trench. The method further includes forming a dielectric layer having a first portion in the first trench and a second portion in the second trench, and forming a first waveguide core that is coupled to the pillar at a top surface of the substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

FIG. 5A is a top view of the structure of FIG. 5 in which FIG. 5 is taken generally along line 5-5.

FIG. 10A is a top view of the structure of FIG. 10 in which FIG. 10 is taken generally along line 10-10.

FIG. 11A is a top view of the structure of FIG. 11 in which FIG. 11 is taken generally along line 11-11.

FIG. 12A is a top view of the structure of FIG. 12 in which FIG. 12 is taken generally along line 12-12.

DETAILED DESCRIPTION

Figure 1:
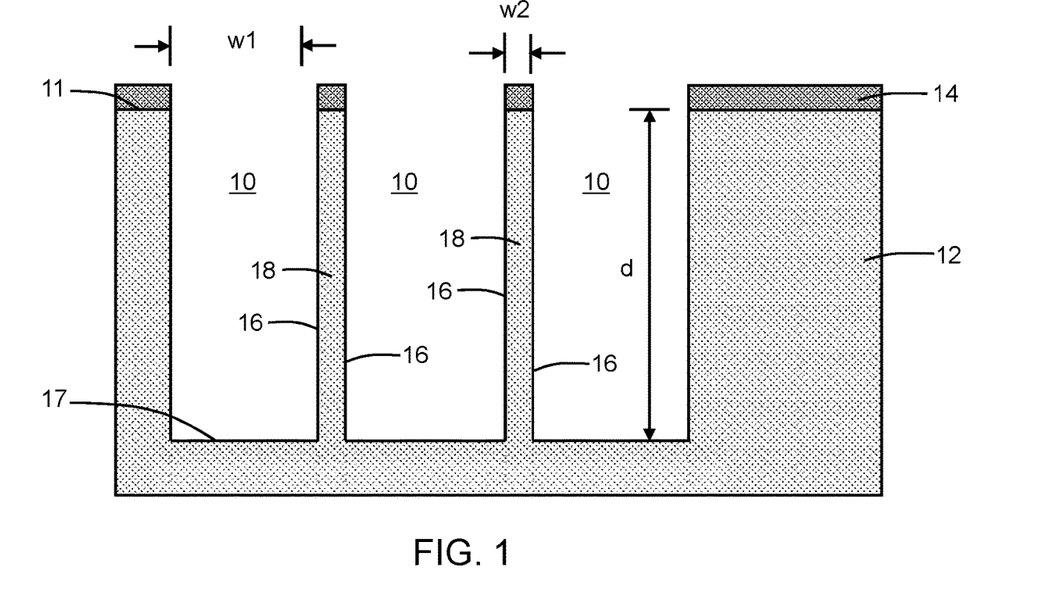
FIGS. 1-6 are cross-sectional views of a structure at successive fabrication stages of a processing method in accordance with embodiments of the invention.

With reference to FIG. 1 and in accordance with embodiments of the invention, trenches 10 are formed in a substrate 12. To that end, a hardmask 14 is formed over a top surface 11 of the substrate 12 and patterned using photolithography and etching processes to define an etch mask. The hardmask 14 may be composed of a dielectric material, such as silicon nitride. The substrate 12 may be, for example, a bulk substrate composed of a single-crystal semiconductor material, such as a bulk single-crystal silicon substrate. With the hardmask 14 present, an etching process, such as a reactive ion etching process, is used to form the trenches 10. The trenches 10 extend into the substrate 12 to respective bottoms 17 at a given depth, d, relative to the top surface 11. In an embodiment, the trenches 10 may extend to a depth of about 2.5 microns to about 3 microns. Each trench 10 has sidewalls 16 that extend to a trench bottom 17, and the semiconductor material of the substrate 12 borders the sidewalls 16 and trench bottom 17 of each trench 10.

Pillars 18 containing portions of the single-crystal semiconductor material of the substrate 12 are located laterally between adjacent trenches 10. The pillars 18 extend from the top surface 11 of the substrate 12 to the same depth as the respective bottoms 17 of the trenches 10. The trenches 10 have a width, w1, between the sidewalls 16, and the pillars 18 have a width, w2, that is significantly less than the width, w1, of the trenches 10. In an embodiment, the width, w1, may be greater than or equal to two (2) microns, and the width, w2, may be about fifty (50) nanometers to about one (1) micron. In an embodiment, the pillars 18 may have an aspect ratio that is less than or equal to sixty (60).

Figure 2:
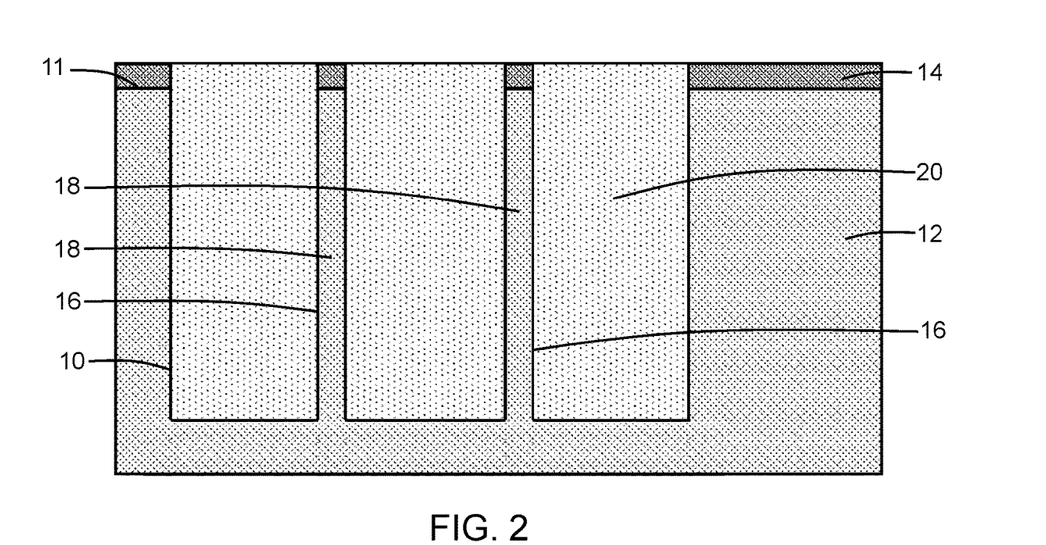

With reference to FIG. 2 in which like reference numerals refer to like features in FIG. 1 and at a subsequent fabrication stage, a dielectric layer 20 is formed that includes respective portions that fill the trenches 10. The dielectric layer 20 may be composed of silicon dioxide that is deposited by chemical vapor deposition and then planarized with chemical-mechanical polishing.

Figure 3:
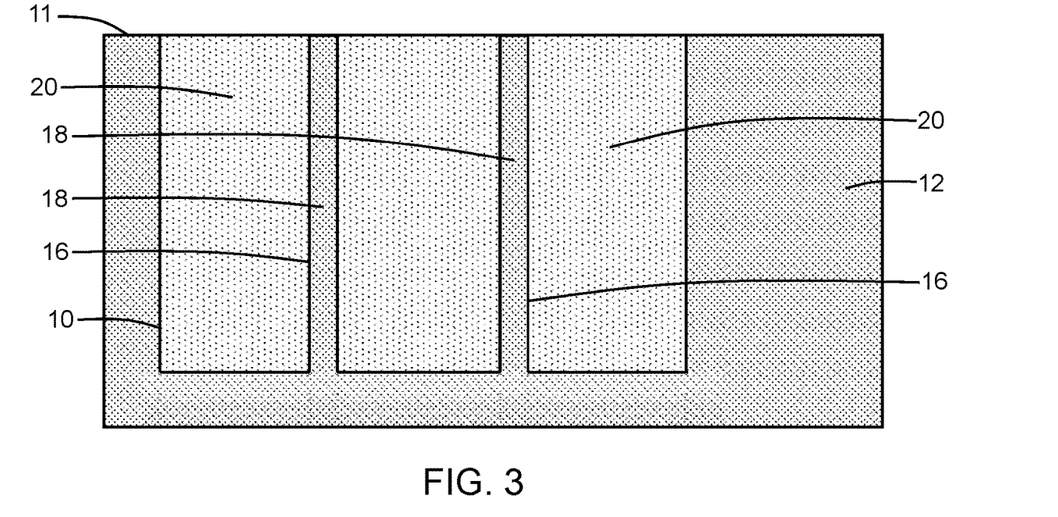

With reference to FIG. 3 in which like reference numerals refer to like features in FIG. 2 and at a subsequent fabrication stage, the hardmask 14 is removed and the dielectric layer 20 in the trenches 10 is then recessed with one or more etching processes such that the top surface 11 of the substrate 12 is exposed. In particular, the pillars 18 of semiconductor material between the dielectric-filled trenches 10 are exposed at the top surface 11 of the substrate 12. In an embodiment, the dielectric layer 20 and the pillars 18 may be coplanar at the top surface 11 of the substrate 12. In an alternative embodiment, the dielectric layer 20 and the pillars 18 may be substantially coplanar at the top surface 11 of the substrate 12.

Figure 4:
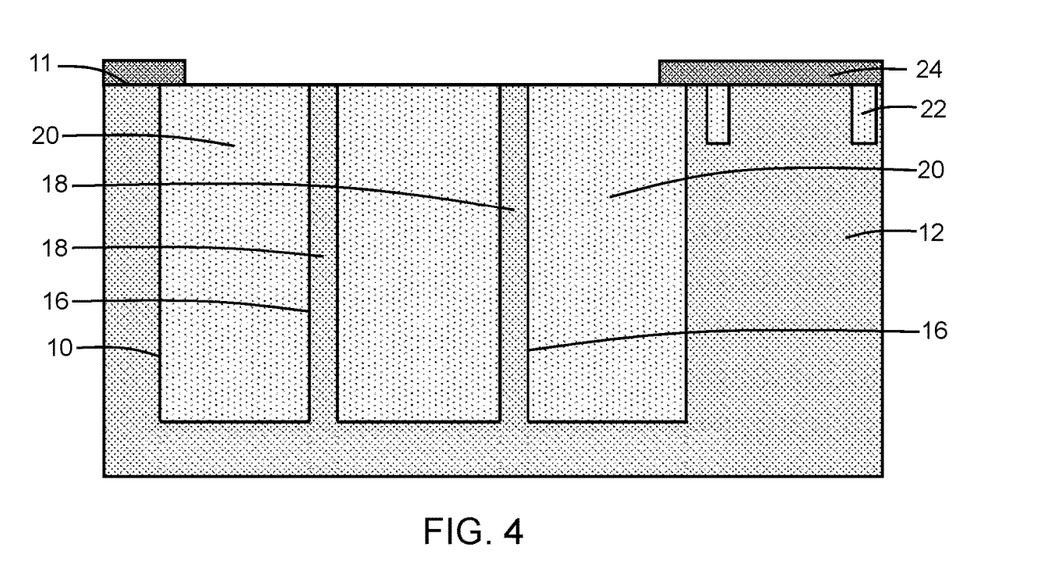

With reference to FIG. 4 in which like reference numerals refer to like features in FIG. 3 and at a subsequent fabrication stage, shallow trench isolation regions 22 are formed in the substrate 12. The shallow trench isolation regions 22 may be formed by etching trenches to a given depth into the substrate 12 and depositing a dielectric material, such as silicon dioxide, in the trenches, followed by planarization with chemical-mechanical polishing. The shallow trench isolation regions 22 surround an active region of the substrate 12 that may be used to subsequently fabricate a field-effect transistor. The trenches 10 penetrate to a greater depth into the substrate 12 than the trenches used to form the shallow trench isolation regions 22. In an alternative embodiment, the shallow trench isolation regions 22 may be formed by portions of the dielectric layer 20 instead of being separately formed.

A dielectric layer 24 is then deposited and patterned by lithography and etching processes to open a region over the pillars 18 and dielectric-filled trenches 10. The dielectric layer 24 may be composed of a dielectric material, such as silicon nitride.

Figure 5:
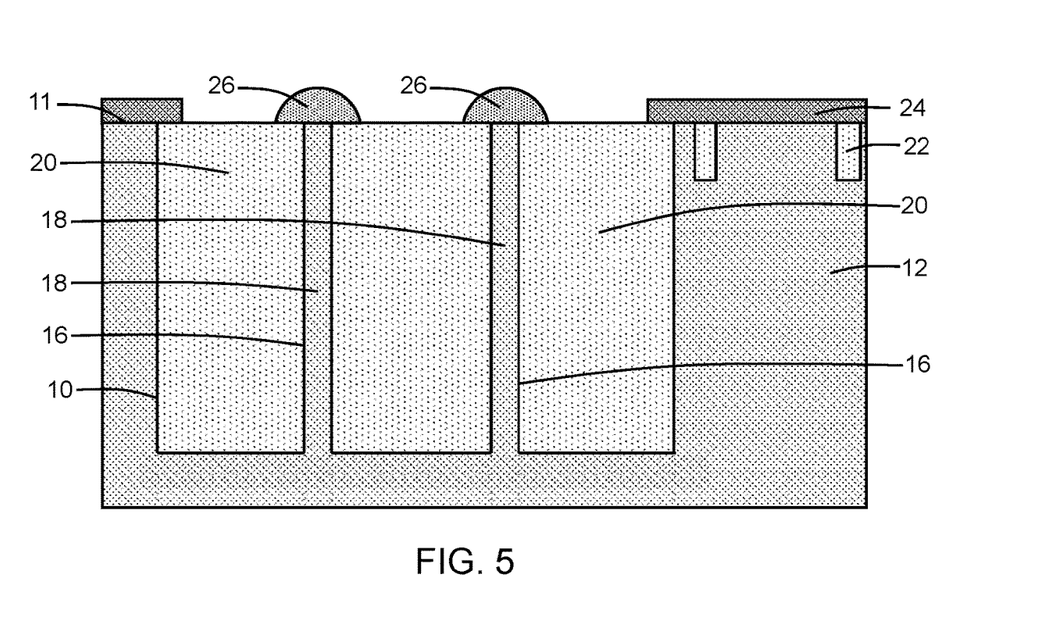
Figure 5A:
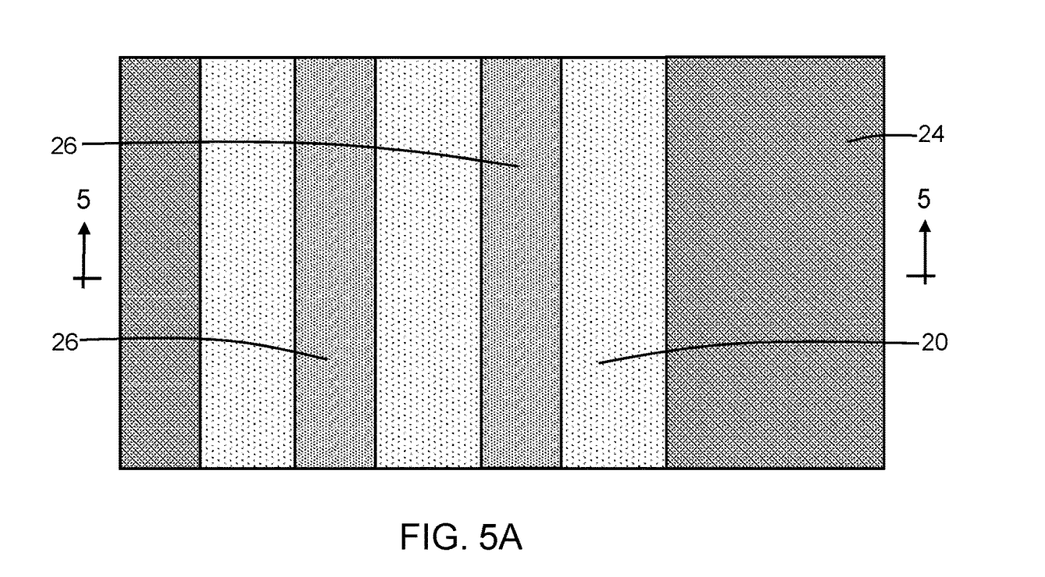

With reference to FIGS. 5, 5A in which like reference numerals refer to like features in FIG. 4 and at a subsequent fabrication stage, waveguide cores 26 are formed by epitaxial growth at the top surface 11 of the substrate 12 and, in particular, by epitaxial growth from the top surface of the pillars 18. The waveguide cores 26 may be composed of single-crystal semiconductor material, such as single-crystal silicon, grown by an epitaxial growth process. In an embodiment, the waveguide cores 26 may be formed by a selective epitaxial growth (SEG) process in which semiconductor material nucleates for epitaxial growth on semiconductor surfaces such as the single-crystal substrate 12, but does not nucleate for growth from insulator surfaces, such as the dielectric layer 24 or the dielectric layer 20. The pillars 18 provide the crystal structure for the epitaxial growth of the waveguide cores 26.

The portions of the dielectric layer 20 in the trenches 10 are arranged below the waveguide cores 26, and each waveguide core 26 overlaps at its sides with the portions of the dielectric layer 20. Because the epitaxial growth is characterized by a vertical growth component and a lateral growth component, the waveguide cores 26 may be shaped as curved portions of cylinders extending along respective longitudinal axes and having a width that is greater than the width of the pillars 18. In an embodiment, the width of the waveguide cores 26 may be equal to approximately three times the width of the pillars 18, and the height of the waveguide cores 26 may be equal to approximately three times the width of the pillars 18.

Figure 6:
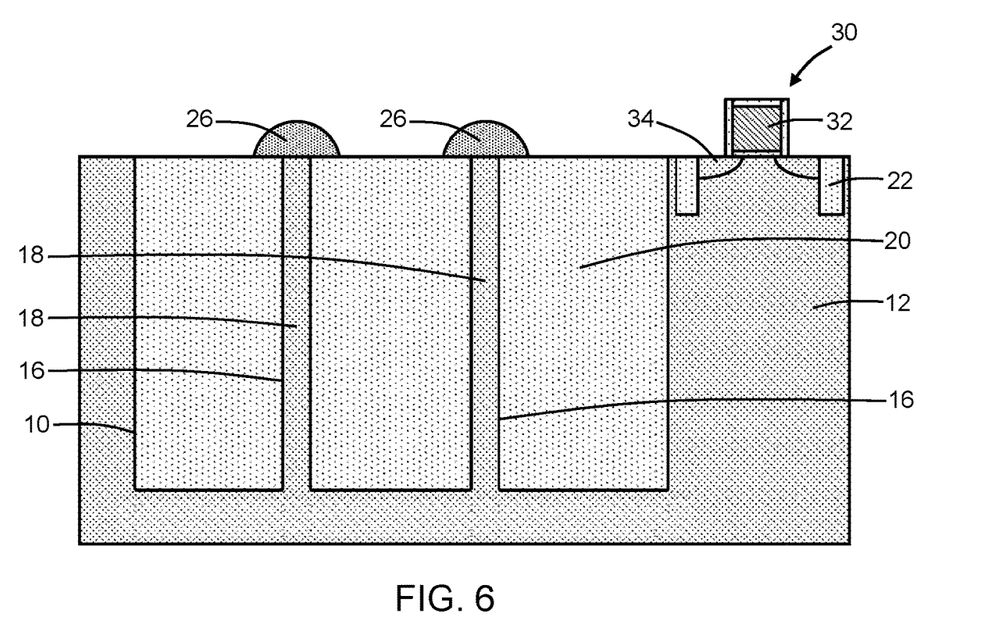

With reference to FIG. 6 in which like reference numerals refer to like features in FIG. 5 and at a subsequent fabrication stage, the dielectric layer 24 is removed using an etching process. A field-effect transistor 30 may be fabricated by front-end-of-line (FEOL) processing as a device structure in the active region of the substrate 12 surrounded by the shallow trench isolation regions 22. The field-effect transistor 30 may include a gate electrode 32 and a gate dielectric formed by depositing a layer stack and patterning the layer stack with photolithography and etching processes. The gate electrode 32 may be composed of a conductor, such as doped polycrystalline silicon (i.e., polysilicon) or a work function metal, and the gate dielectric may be composed of an electrical insulator, such as silicon dioxide or hafnium oxide. The field-effect transistor 30 may include other elements such as halo regions, lightly doped drain extensions, source/drain regions 34 in the well, and sidewall spacers on the gate electrode 32. In an alternative embodiment, a different type of transistor, such as a heterojunction bipolar transistor, may be fabricated instead of the field-effect transistor 30.

The portions of the dielectric layer 20 provide a bottom cladding for the waveguide cores 26. The dielectric layer 20 replaces the buried oxide layer of a silicon-on-insulator substrate, which enables the use of a cheaper bulk wafer as the substrate 12 for fabricating the photonics chip.

Figure 7:
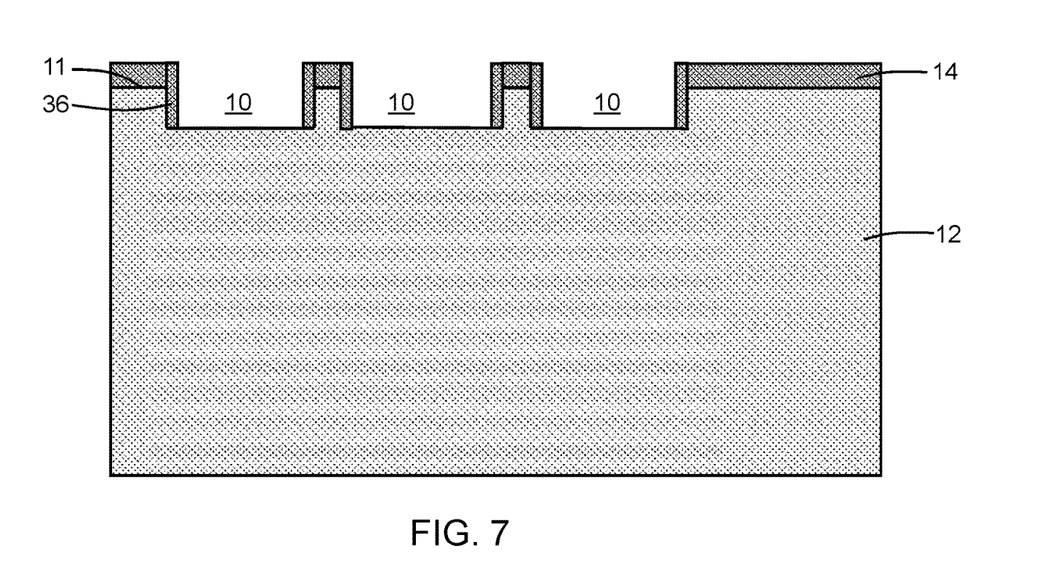
FIGS. 7-9 are cross-sectional views of a structure at successive fabrication stages of a processing method in accordance with alternative embodiments of the invention.

With reference to FIG. 7 in which like reference numerals refer to like features in FIG. 1 and in accordance with alternative embodiments, the trenches 10 may be etched into the substrate 12 to a depth that is less than the full intended depth. The partially-etched trenches 10 may have a width that is slightly greater than w1 (FIG. 1). Sidewall spacers 36 may be formed that line the partially-etched trenches 10 and hardmask 14. The sidewall spacers 36 may be composed of a dielectric material that is deposited by a conformal deposition process, such as silicon nitride deposited by atomic layer deposition, and then etched with an anisotropic etching process, such as reactive ion etching.

Figure 8:
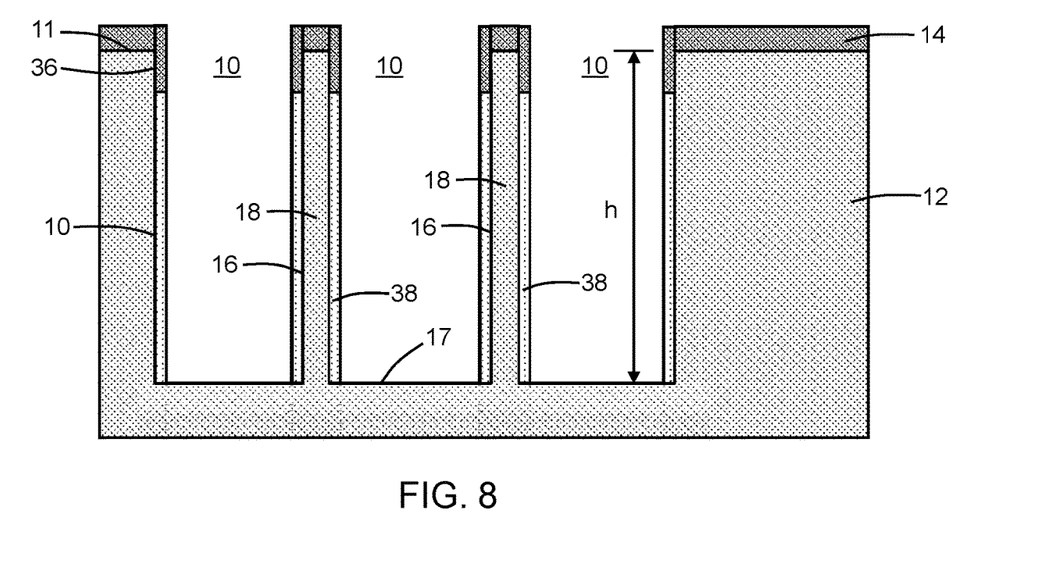

With reference to FIG. 8 in which like reference numerals refer to like features in FIG. 7 and at a subsequent fabrication stage, the trenches 10 are further etched to their full given depth into the substrate 12, as described in connection with FIG. 1, after forming the sidewall spacers 36. A dielectric layer 38 is formed in the substrate 12 at the sidewalls 16 and bottom 17 of each trench 10. In an embodiment, a thermal oxidation process may be used to form the dielectric layer 38. The formation of the dielectric layer 38 narrows the width of the pillars 18 as a thickness of the semiconductor material of the pillars 18 is converted to silicon dioxide by the thermal oxidation process. In an embodiment, the initial width of the pillars 18 may be increased such that a final width target (e.g., about 50 nanometers to about 1 micron) is achieved after performing the thermal oxidation process. In an embodiment, the pillars 18 may have the width, w2 (FIG. 1).

In an alternative embodiment, the semiconductor material of the pillars 18 may be implanted with ions to damage the crystal structure of the substrate 12 along the sidewalls 16 of the trenches 10 and thereby increase the oxidation rate. The implantation conditions (e.g., ion species (e.g., boron, arsenic, germanium, silicon, oxygen), dose, kinetic energy, tilt angle) may be selected to tune the amount of damage imparted to the crystal structure of the substrate 12.

Figure 9:
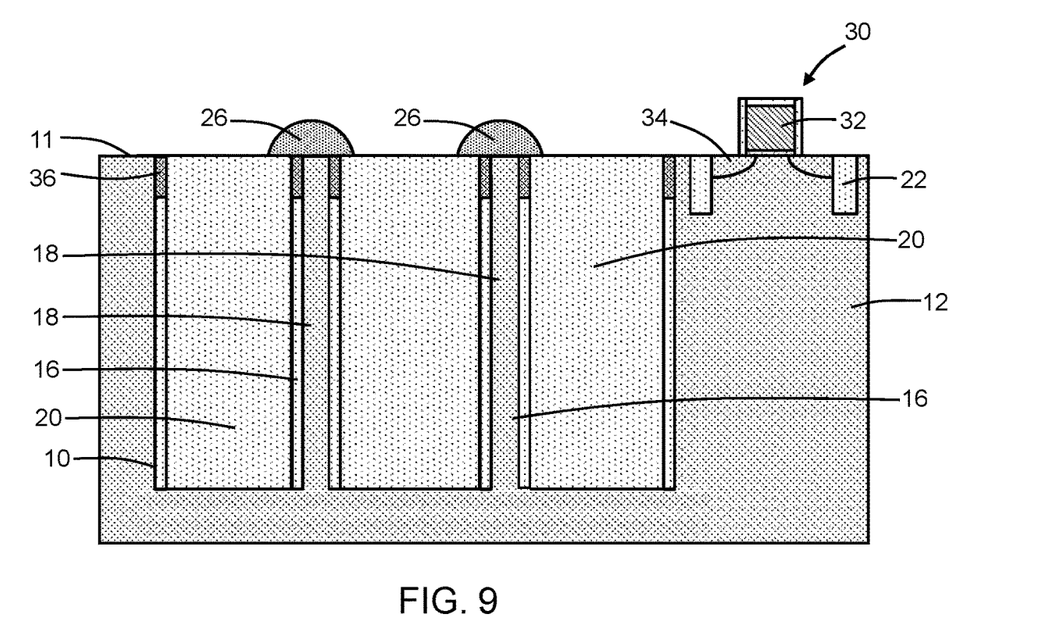

With reference to FIG. 9 in which like reference numerals refer to like features in FIG. 8 and at a subsequent fabrication stage, processing continues as described in connection with FIGS. 2-6 to form the waveguide cores 26 and the field-effect transistor 30. The sidewall spacers 36 are present in the final structure beneath the top surface 11 and under the waveguide cores 26. Each sidewall spacer 36 is positioned in a vertical direction between one of the waveguide cores 26 and one of the dielectric layers 38, and each sidewall spacer 36 is positioned in a lateral direction between the portion of the dielectric layer 24 in one of the trenches 10 and one of the pillars 18. Each sidewall spacer 36 and its underlying dielectric layer 28 may have a summed height, h, (FIG. 8) relative to the top surface 11 that is equal or substantially equal to the depth of the trenches 10.

Figure 10:
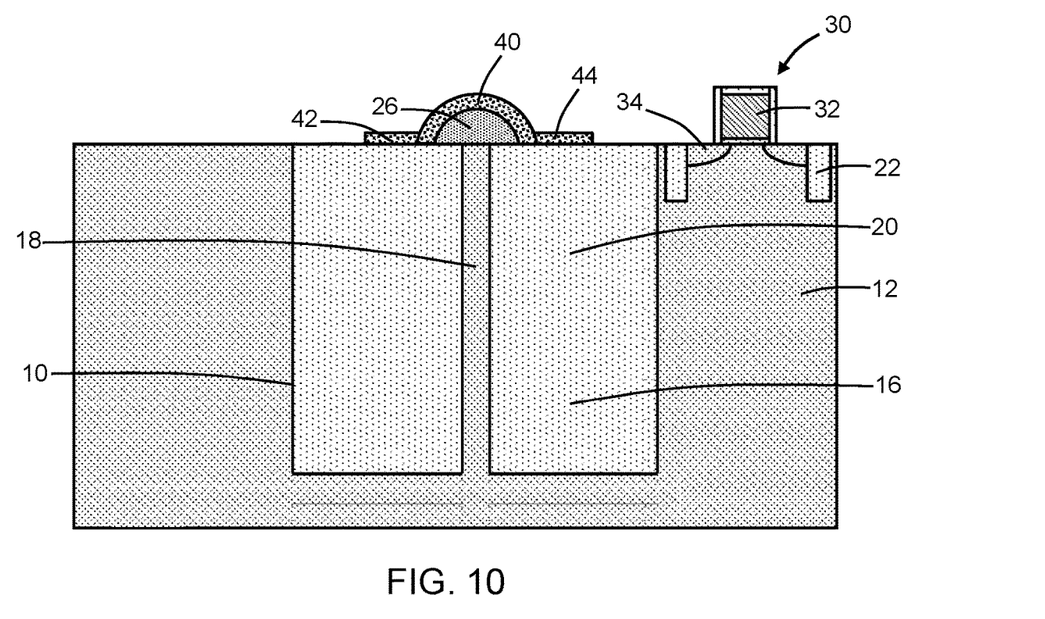
FIG. 10 is a cross-sectional view of a structure in accordance with alternative embodiments of the invention.
Figure 10A:
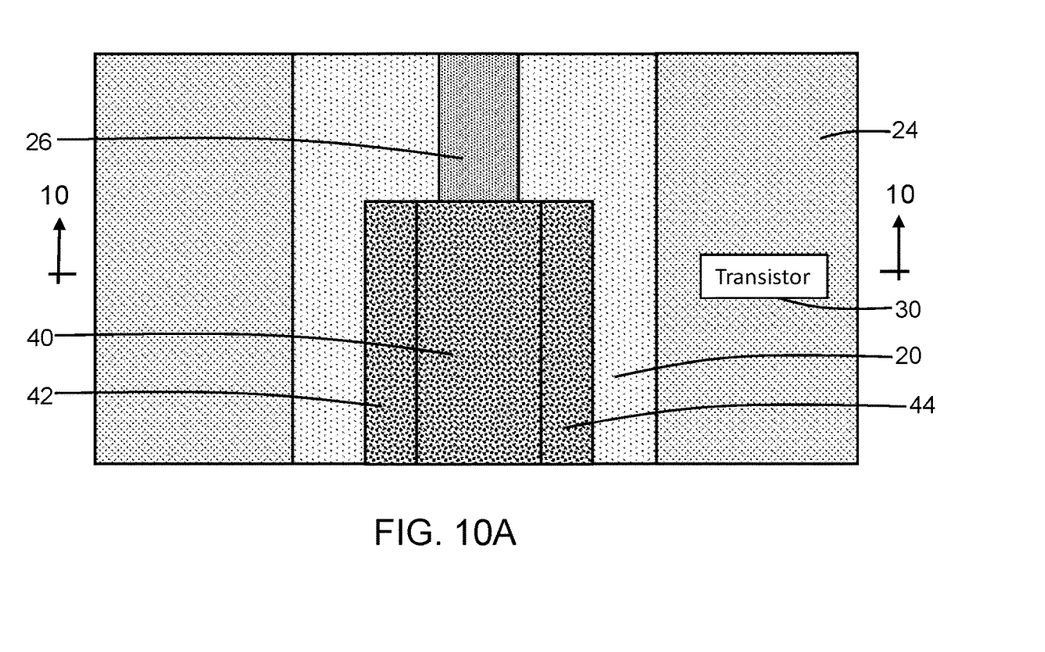

With reference to FIGS. 10, 10A in which like reference numerals refer to like features in FIG. 6 and in accordance with alternative embodiments, a photodetector 40 may be formed as a conformal layer over and adjacent to one of the waveguide cores 26. In an embodiment, the photodetector 40 may be composed of a semiconductor material, such as germanium or a germanium-tin alloy, that is epitaxially grown or deposited over the waveguide core 26 and patterned with lithography and etching processes. Layers 42, 44 are formed over the portions of the dielectric layer 24 in the trenches 10. The layer 42 may be doped to have n-type conductivity, and the layer 44 may be doped to have p-type conductivity. The layers 42, 44, which may serve as contacts for the photodetector 40, may be doped by ion implantation using a separate implantation mask, or may be doped by co-implantation when the source/drain regions 34 of the field-effect transistor 30 are formed.

Figure 11:
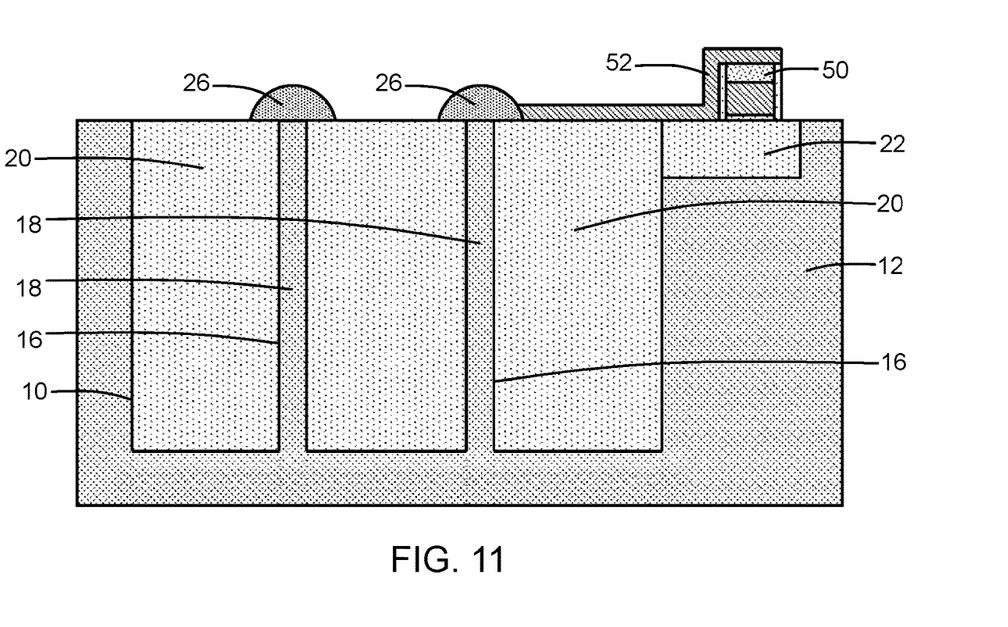
FIG. 11 is a cross-sectional view of a structure in accordance with alternative embodiments of the invention.
Figure 11A:
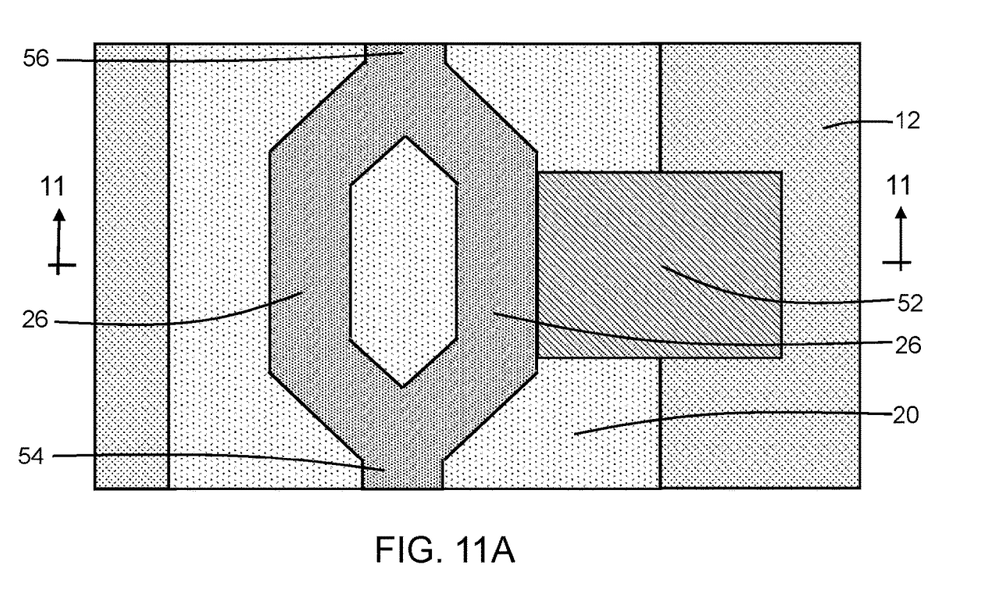

With reference to FIGS. 11, 11A in which like reference numerals refer to like features in FIG. 6 and in accordance with alternative embodiments, the waveguide cores 26 may constitute the arms of a Mach-Zehnder interferometer modulator. The arms of the Mach-Zehnder interferometer modulator are coupled to an input waveguide 54 that guides laser light to the arms and an output waveguide 56 that guides modulated laser light from the arms. A heater 50 is formed adjacent to the waveguide core 26 that is its nearest neighbor. The heater 50 may be a silicided resistor embodied in a partially-silicided polysilicon body that includes a silicided upper section formed by a silicidation process. The heater 50 may be located over a shallow trench isolation region 22, which provides thermal isolation during operation.

A layer 52 provides a bridge that connects the heater 50 with the adjacent waveguide core 26. The layer 52, which may be composed of polysilicon patterned by photolithography and etching processes, provides a path for the transfer of heat from the heater 50 to the waveguide core 26. The layer 52 may overlap with a section of the adjacent waveguide core 26. The layer 52 may be located in part over the shallow trench isolation region 22 between the heater 50 and the waveguide core 26, as well as in part over an adjacent portion of the dielectric layer 20. The dielectric materials thermally isolate the heater 50 from the substrate 12 during operation.

During operation, heat transferred to the waveguide core 26 from the heater 50 through the layer 52 may be used to modulate laser light received from the input waveguide 54 to provide digitized output signals at the output waveguide 56 by changing the permittivity (i.e., dielectric constant) of the heated waveguide core 26. The change to the permittivity of the heated waveguide core 26 prompts a change in the refractive index of its semiconductor material.

Figure 12:
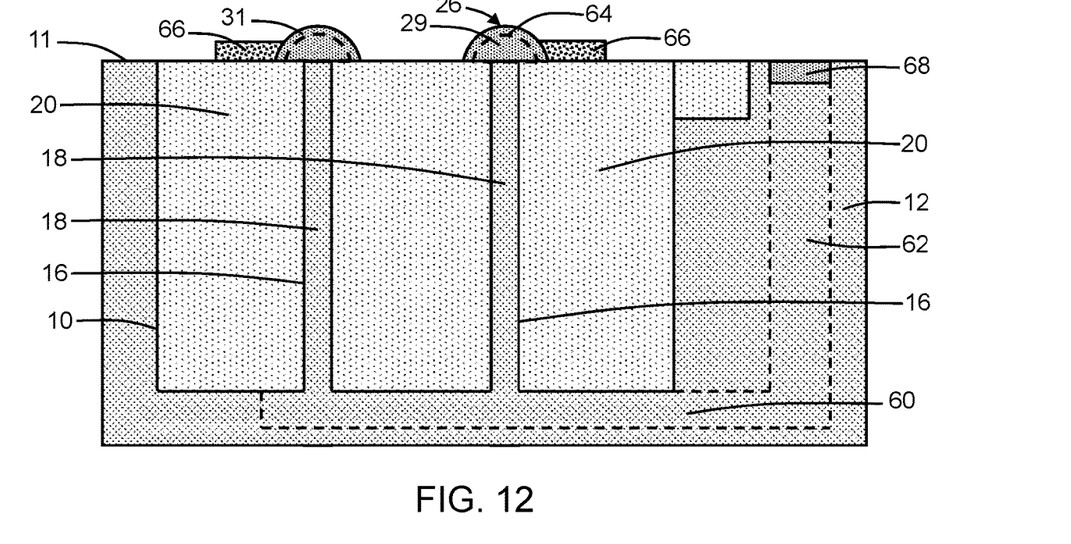
FIG. 12 is a cross-sectional view of a structure in accordance with alternative embodiments of the invention.
Figure 12A:
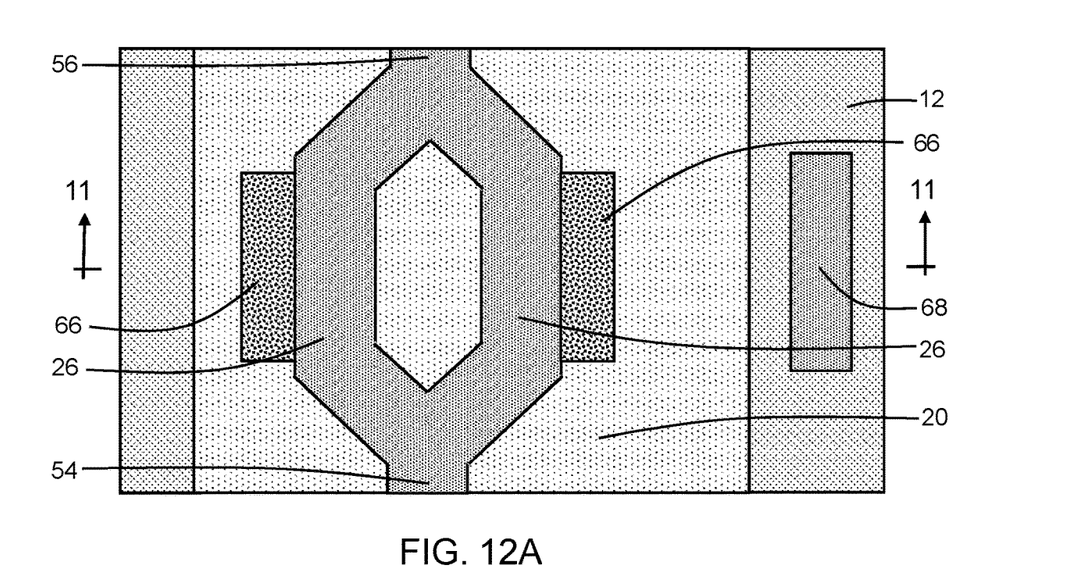

With reference to FIGS. 12, 12A in which like reference numerals refer to like features in FIGS. 11, 11A and in accordance with alternative embodiments, the waveguide cores 26 may be elements incorporated into a different type of Mach-Zehnder interferometer modulator. In that regard, a well 60 may be formed in the substrate 12 beneath the trenches 10. The pillars 18 and lower portions 29 of the waveguide cores 26 may be doped to have the same conductivity type as the well 60. A reach-through region 62 of the same conductivity type is formed adjacent to the waveguide cores 26. The reach-through region 62 extends from the top surface 11 of the substrate 12 to the well 60.

Upper portions 31 of the waveguide cores 26 may be doped to have an opposite conductivity type from the lower portions 29 of the waveguide cores 26, which defines p-n junctions 64. In an embodiment, the upper portions 31 of the waveguide cores 26 may be doped with low-energy implantation.

Heavily-doped contacts 66 having the same conductivity type as the upper portions 31 of the waveguide cores 26 are formed on the dielectric layer 20. The heavily-doped contacts 66 are respectively coupled to the upper portions 31 of the waveguide cores 26. A heavily-doped contact 68 is formed in the reach-through region 62 at the top surface 11 of the substrate 12. In an embodiment, the pillars 18, lower portions 29 of the waveguide cores 26, well 60, reach-through region 62, and heavily-doped contact 68 may be doped to have n-type conductivity, and the upper portions 31 of the waveguide cores 26 and the heavily-doped contacts 66 may be doped to have p-type conductivity.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a bulk substrate comprised of a semiconductor material, the bulk substrate including a top surface, a first trench extending from the top surface into the bulk substrate, a second trench extending from the top surface into the bulk substrate, and a first pillar of the semiconductor material laterally positioned between the first trench and the second trench;
   a first dielectric layer having a first portion in the first trench and a second portion in the second trench; and a first waveguide core directly on the first pillar at the top surface of the bulk substrate, the first waveguide core overlapping in part with the first portion of the first dielectric layer at the top surface of the bulk substrate, and the first waveguide core overlapping in part with the second portion of the first dielectric layer at the top surface of the bulk substrate, wherein the first portion and the second portion of the first dielectric layer are arranged below the first waveguide core.

2. The structure of claim 1 wherein the first pillar, the first portion of the first dielectric layer, and the second portion of the first dielectric layer are substantially coplanar at the top surface of the bulk substrate.

3. The structure of claim 1 wherein the first trench has a depth, the first pillar extends from the top surface of the bulk substrate over the depth of the first trench, and the first pillar is connected to a portion of the bulk substrate beneath the first trench and the second trench.

4. The structure of claim 1 wherein the first waveguide core has a curved shape that is wider than the first pillar.

5. The structure of claim 1 wherein the first pillar is narrower than the first portion of the first dielectric layer, and the first pillar is narrower than the second portion of the first dielectric layer.

6. The structure of claim 1 wherein the first waveguide core has a curved shape, and further comprising:
a photodetector comprising a conformal layer positioned over the curved shape of the first waveguide core.

7. The structure of claim 6 wherein the conformal layer comprises germanium.

8. The structure of claim 1 further comprising:
a heater positioned over the top surface of the bulk substrate; and
a conductive layer coupling the heater to the first waveguide core.

9. The structure of claim 8 wherein the bulk substrate includes a third trench and a second pillar of the semiconductor material laterally positioned between the second trench and the third trench, the first dielectric layer has a third portion in the third trench, and further comprising:
a second waveguide core coupled to the second pillar at the top surface of the bulk substrate,
wherein the first waveguide core and the second waveguide core are respective arms of a Mach-Zehnder interferometer modulator.

10. The structure of claim 8 wherein the heater is a silicided resistor formed adjacent to the first waveguide core.

11. The structure of claim 1 further comprising:
a transistor in a different region of the bulk substrate than the first waveguide core.

12. The structure of claim 1 wherein the first waveguide core includes a p-type region, an n-type region, and a p-n junction at an interface between the p-type region and the n-type region.

13. The structure of claim 1 further comprising:
a spacer in the first trench and on the first pillar; and
a second dielectric layer beneath the spacer, the second dielectric layer positioned between the first portion of the first dielectric layer and the first pillar.

14. The structure of claim 13 wherein the spacer and the second dielectric layer have a summed height relative to the top surface of the bulk substrate, the first trench has a depth relative to the top surface of the bulk substrate, and the depth of the first trench is substantially equal to the summed height of the spacer and the second dielectric layer.

15. The structure of claim 1 wherein the first pillar has a width ranging from about fifty nanometers to about one micron, and the first pillar has an aspect ratio that is less than or equal to sixty.

16. A method comprising:
forming a first trench and a second trench in a substrate comprised of a semiconductor material, wherein a pillar of the semiconductor material laterally positioned between the first trench and the second trench;
forming a spacer in the first trench and on the pillar;
forming a second dielectric layer beneath the spacer;
forming a first dielectric layer having a first portion in the first trench and a second portion in the second trench; and
forming a waveguide core coupled to the pillar at a top surface of the substrate,
wherein the second dielectric layer is positioned between the first portion of the first dielectric layer and the pillar.

17. The method of claim 16 further comprising:
forming a heater positioned over the top surface of the substrate; and
forming a conductive layer coupling the heater to the waveguide core.

18. The method of claim 16 wherein the waveguide core has a curved shape, and further comprising:
forming a photodetector conformally positioned over the curved shape of the waveguide core.

19. The method of claim 16 wherein the waveguide core is formed by an epitaxial growth process, and further comprising:
forming a p-type region and an n-type region in the waveguide core,
wherein a p-n junction is defined at an interface between the p-type region and the n-type region.

20. The structure of claim 1 wherein the first pillar, the first trench, and the second trench extend to equal depths in the bulk substrate relative to the top surface of the bulk substrate.

* * * * *